United States Patent
d'Alessandro

(10) Patent No.: US 9,160,344 B2
(45) Date of Patent: Oct. 13, 2015

(54) RELIABLE CRYSTAL OSCILLATOR START-UP

(71) Applicant: u-blox AG, Thalwil (CH)

(72) Inventor: Carmine d'Alessandro, Rueschlikon (CH)

(73) Assignee: u-blox AG, Thalwil (CH)

(*) Notice: Subject to any disclaimer, the term of this patent is extended or adjusted under 35 U.S.C. 154(b) by 0 days.

(21) Appl. No.: 14/611,112

(22) Filed: Jan. 30, 2015

(65) Prior Publication Data
US 2015/0244378 A1     Aug. 27, 2015

(30) Foreign Application Priority Data
Jan. 31, 2014   (EP) .................................... 14000358

(51) Int. Cl.
*H03B 5/32*      (2006.01)
*H03L 3/00*      (2006.01)
*H03B 5/36*      (2006.01)

(52) U.S. Cl.
CPC .. *H03L 3/00* (2013.01); *H03B 5/32* (2013.01); *H03B 5/36* (2013.01)

(58) Field of Classification Search
CPC ............... H03B 5/36; H03B 5/32; H03L 3/00
USPC .......... 331/183, 158, 116 R, 116 FE
See application file for complete search history.

(56) References Cited

U.S. PATENT DOCUMENTS

| | | |
|---|---|---|
| 5,473,284 A | 12/1995 | Jaentti et al. |
| 6,094,105 A | 7/2000 | Williamson |
| 7,710,212 B2 | 5/2010 | Seliverstov |
| 7,940,137 B2 | 5/2011 | Rosik et al. |
| 8,816,786 B2 * | 8/2014 | Tham ............................ 331/109 |
| 2001/0048349 A1 | 12/2001 | Matsumoto et al. |
| 2010/0289591 A1 | 11/2010 | Garcia |
| 2011/0037527 A1 * | 2/2011 | Shrivastava et al. .......... 331/158 |
| 2012/0154066 A1 | 6/2012 | Kubota |
| 2013/0265116 A1 | 10/2013 | Su et al. |

OTHER PUBLICATIONS

Extended European Search Report, EP Application 14000358.3, dated Jun. 18, 2014.

* cited by examiner

*Primary Examiner* — Arnold Kinkead
(74) *Attorney, Agent, or Firm* — Edward B. Weller

(57) ABSTRACT

The method concerns the reliable start-up of a crystal oscillator where the drive levels the crystal is subjected to are kept low in order to avoid over-driving the crystal. After applying a start-up value of a parameter controlling the drive level where the drive level associated with the start-up value is rather high such that reliable start-up is ensured the parameter is modified step-wise so as to reduce the drive level until the crystal oscillator ceases to operate regularly. To assess whether this is the case, the frequency of the crystal oscillator is compared with the frequency of an auxiliary oscillator. A safety margin is added to the parameter and the result stored in a non-volatile memory as an operating value. The crystal oscillator is then restarted with the start-up value and after a delay the operating value is applied.

18 Claims, 4 Drawing Sheets

RELIABLE CRYSTAL OSCILLATOR START-UP

RELATED APPLICATIONS

This application claims the benefit of priority under 35 USC §119 to European Patent Application EP14000358.3 filed on Jan. 31, 2014, the entire contents of which are incorporated herein by reference.

FIELD

The disclosure concerns a method for starting up a crystal oscillator and an apparatus comprising a crystal oscillator for carrying out the method. Crystal oscillators are used in clocks for electronic devices where a reliable and precise frequency reference is essential.

BACKGROUND

U.S. Pat. No. 7,940,137 B2 discloses a method for controlling loop gain of a crystal oscillator circuit using a bias current. A bias current which is employed as a parameter for controlling the drive level of the oscillator is set to a high value at start-up and then reduced stepwise until the amplitude of the oscillator signal falls below a threshold. This requires a rather complicated circuit with expensive high-quality components for monitoring the amplitude and controlling the bias current via a feedback loop involving rectifying and analog to digital (A/D)-converting the output signal and digital to analog (D/A)-converting a digital signal which controls the bias current. The rather involved signal processing also causes elevated levels of power consumption.

SUMMARY

It is a primary object of the invention to provide a generic method which is simple and robust as well as easy to implement and keeps the oscillator operating at low drive levels. This object may be achieved by a method of starting up a crystal oscillator with a crystal and an oscillator circuit connected to a non-volatile memory, where a parameter which controls a drive level of the crystal is configured. The method comprises setting the value of the parameter to a start-up value where the associated drive level is high enough to assure that the crystal oscillator begins to oscillate, and modifying the value of the parameter such as to monotonically reduce the drive level of the crystal while monitoring the crystal oscillator. The method further comprises determining, in the course of monitoring the crystal oscillator, a breakdown value of the parameter where the crystal oscillator ceases to operate regularly, employing as a criterion of regular operation the condition that a cycle count of the crystal oscillator signal does not deviate from a cycle count of a reference signal by more than a predetermined amount, and selecting an operating value of the parameter such that the drive level associated with said operating value is above the drive level associated with the breakdown value by a safety margin.

Another advantage realised by the inventive method is the fact that the drive levels are automatically adapted to the properties of the individual crystal, ensuring that the crystal oscillator operates in a regular manner but is not damaged by overdriving.

It is a further object of the invention to provide an apparatus for carrying out the method according to the invention.

BRIEF DESCRIPTION OF THE DRAWINGS

In the following the invention is described in more detail with reference to drawings showing an embodiment of the invention where.

DESCRIPTION

Figure 1:
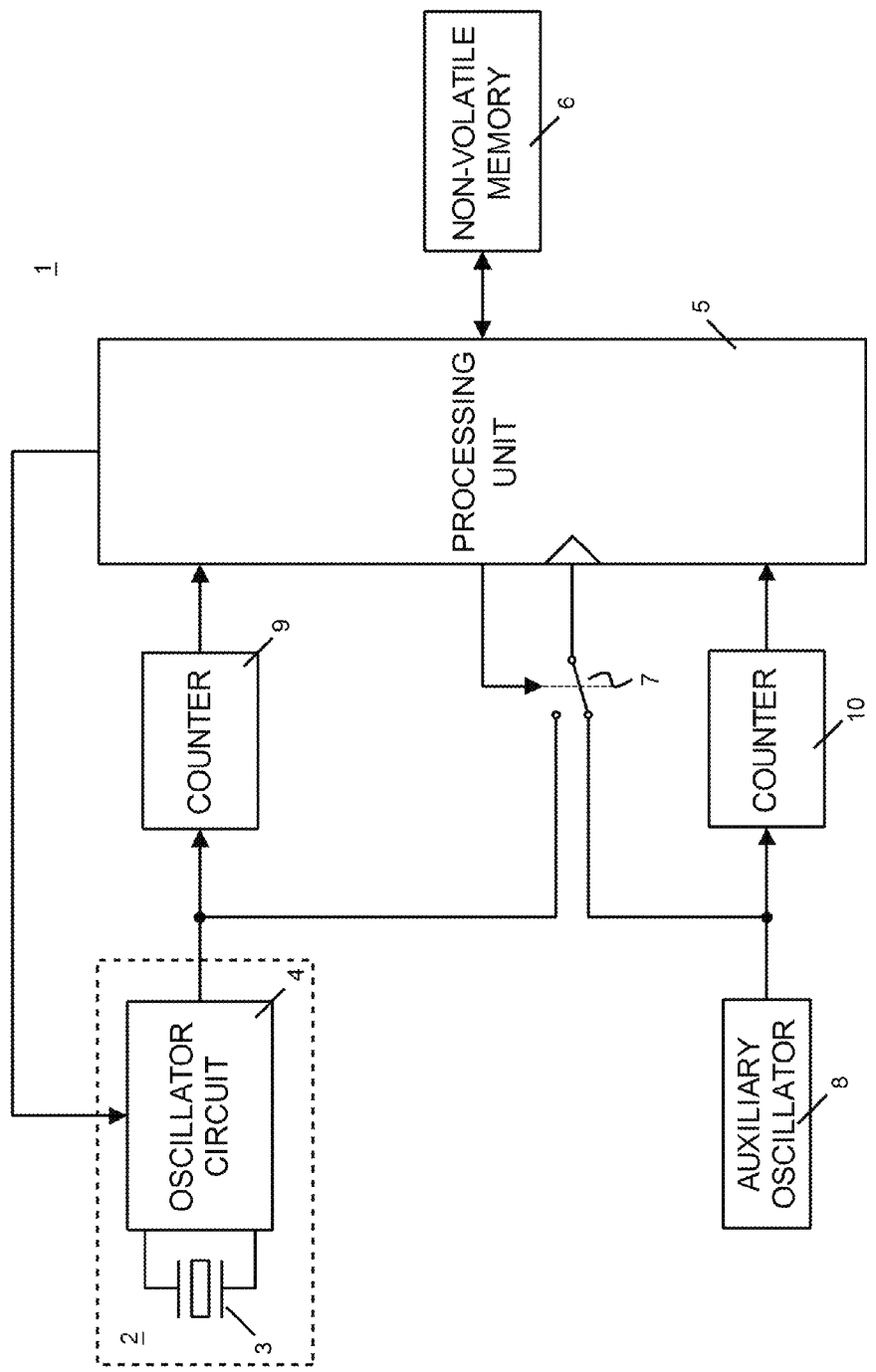
FIG. 1 shows a block diagram of an apparatus according to the invention.

The apparatus 1 of FIG. 1 comprises a crystal oscillator 2 with a crystal 3, usually a quartz crystal, and an oscillator circuit 4 which is connected to the crystal 3 and is used to control the crystal 3. The oscillator circuit 4 is in turn controlled by a processing unit 5, preferably a microprocessor, which is connected to a non-volatile memory 6, e.g., a battery-backup RAM. The non-volatile memory 6 contains at least one look-up table and further memory locations for storing at least a start-up value and an operating value as will be explained below.

A switch 7 can be used to connect a clock input of the processing unit 5 to an output of the crystal oscillator 2 or, alternatively, to an output of an auxiliary oscillator 8. The auxiliary oscillator 8 can be realized as another crystal oscillator or, preferably, as a ring oscillator or an LC-tank oscillator. The auxiliary oscillator 8 is not switched off during downtimes and is therefore continually running.

The output of the crystal oscillator 2 is connected to a first counter 9 whose output is connected to another input of processing unit 5. In the same way a second counter 10 is connected between the auxiliary oscillator 8 and a further input of processing unit 5. The counters 9 and 10 can be implemented within the processing unit 5 and thus need not be separate components.

The oscillator circuit 4 is used to set a drive level for the crystal 2. The drive level is essentially the amount of power, i.e., energy per time unit, dissipated in the crystal 3. For achieving reliable and robust crystal oscillator performance the drive level is appropriately selected.

If the drive level is too low the crystal will cease to operate regularly which is reflected in a relatively large deviation of its oscillation frequency from a reference frequency. If the drive level is too low at start-up the start-up will fail, the crystal 3 not beginning to oscillate at all. For the start-up to work a minimum drive level is usually required which can vary greatly from crystal to crystal. On the other hand, an excessively high drive level will increase the power consumption of the crystal oscillator and negatively impact phase noise. Furthermore, it may result in unstable operation of the crystal oscillator and, in particular, if it is applied for an extended period of time, accelerate the aging of the crystal or even damage it. The drive level should therefore be maintained at levels which are just high enough to assure proper start-up and regular oscillation.

The drive level is directly controlled by a parameter of the oscillator circuit 4 and set by the processing unit 5. This parameter may be a programmable bias current in the oscillator circuit 4 which is used to control the gain of an amplifier and thereby the loop gain and the drive level. In a manner well known in the art the bias current may be produced by a programmable current source with current source transistors which are switched on or off. Alternatively, the parameter may be a capacitance of a programmable load capacitor. Increasing the load capacitance decreases the loop gain and reduces the drive level. The programmable load capacitor can be implemented as a bank of small capacitances which are switched into and out of operation. There are other possibilities well known in the art, e.g., placing a programmable resistor in series with the crystal in the loop.

In the following the start-up method according to the invention will be explained with reference to FIG. 2.

The start of the procedure at 11 can be triggered by an external event, e.g., in that a device comprising the apparatus 1, like a radio receiver, a mobile telephone, smartphone or Global Navigation Satellite System (GNSS) receiver, which was previously non-operative (interval A in FIG. 4) is switched on (at the beginning of interval B). During start-up switch 7 connects auxiliary oscillator 8, whose output signal serves as a clock signal, to processing unit 5. In 12 the processing unit 5 checks whether an operating value and—depending on the embodiment—also a start-up value of the parameter controlling the drive level of the crystal 3 are stored in memory locations of the non-volatile memory 6. In the example the controlling parameter is a bias current in the operator circuit 4.

If the parameter values in question are stored the method continues with 13 where the processing unit 5 reads the start-up value from the non-volatile memory. The start-up value is then applied, i.e., the bias current is set to this value in oscillator circuit 4, whereby the crystal 3 is subjected to a corresponding drive level for a certain period of time which is just long enough to ensure that crystal oscillator 2 starts up properly and reaches a stable state of regular operation. After this delay, at 14, the processing unit 5 reads the operating value from the non-volatile memory 6 and then applies it as a parameter to the oscillator circuit 4. The drive level is thereby reduced to a level which might not be sufficient for reliable start-up but assures further regular operation of the already started crystal oscillator 2 without subjecting the crystal 3 to an unnecessarily high risk of damage or accelerated aging. The start-up procedure ends at 15. The position of switch 7 is changed such that it connects crystal oscillator 2, which now produces the clock signal, to processing unit 5.

If a start-up value and an operating value are not already stored in non-volatile memory 6 a start-up value is determined at 16. This can be done in more than one way as will be explained below. The determined start-up value is then applied (at the beginning of time interval B in FIG. 4).

Figure 4:
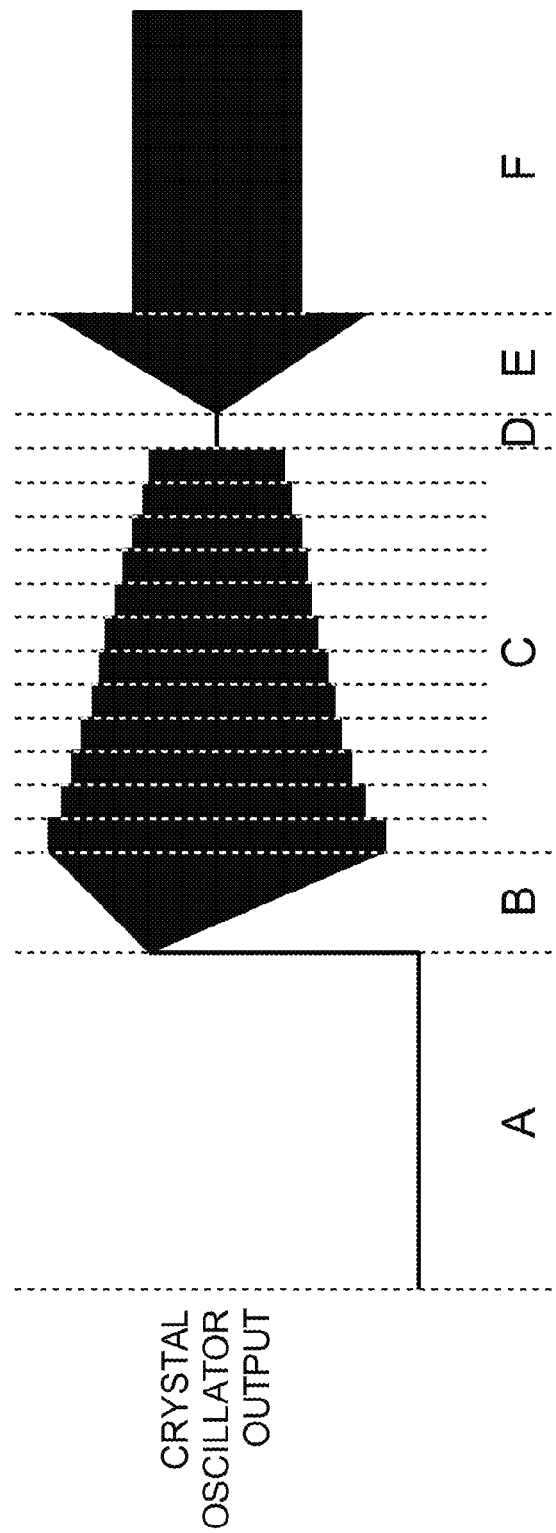
FIG. 4 shows an envelope of the crystal oscillator output signal as a function of time during start-up.

After a delay the processing unit 5, at 17, assesses whether the crystal oscillator 2 is operating regularly (at the end of time interval B in FIG. 4). For this assessment the output signal of the crystal oscillator 2 is monitored and its frequency is compared with the frequency of a reference signal produced by the auxiliary oscillator 8. As a criterion of regular operation the following condition is then employed: If the frequency of the output signal deviates from the reference frequency by not more than a certain predetermined amount the crystal oscillator 2 is operating regularly, otherwise the crystal oscillator 2 is not operating regularly. This test can be carried out using the counters 9 and 10, e.g., counting the cycles of the crystal oscillator 2 in the first counter 9 and of the auxiliary oscillator 8 in the second counter 10 and checking whether, when the cycle count at the second counter 10 has reached a predetermined number, the cycle count at first counter 9 is within a predetermined tolerance interval. In this case it is found that the crystal oscillator 2 operates regularly.

Obviously, it is not necessary that the output signal of the crystal oscillator 2 and the reference signal share the same frequency nor is it necessary that the auxiliary oscillator 8 be very precise. Only the nominal relationship between the frequencies of the crystal oscillator 2 and the auxiliary oscillator 8 need be known. Where the frequencies are nominally the same, assessment of whether the crystal oscillator 2 operates regularly can be carried out with a single up/down counter which counts up in response to one of the oscillator signals, e.g., the signal of crystal oscillator 2, and down in response to the other oscillator signal, e.g., the signal of auxiliary oscillator 8. If the absolute value of the count is not larger than a predetermined threshold the crystal oscillator 2 is found to operate regularly.

If the crystal oscillator is, in 17, found to operate regularly the method proceeds with 18 where the parameter is modified in a way which reduces the drive level and returns to 17 where it is again assessed whether the crystal oscillator 2 still operates regularly. The parameter is modified by one step at a time. There are several possible ways in which the parameter can be modified in order to reduce the drive level. The parameter is decremented—if it is a bias current—or incremented—if it is, e.g., a load capacitance—by a fixed step-size at a time. Or it can be set to a next value the processing unit 5 reads from a look-up table contained in the non-volatile memory 6 where the values in the look-up table form a decreasing or increasing series, respectively. It is also possible to employ several look-up tables, each associated with a different value of some other property of the oscillator circuit 4 which influences the drive level. E.g., two look-up tables for bias currents can be used where each is associated with one of two values which the load capacitance of the oscillator circuit 4 may assume. As a variant, it is also possible to employ the same look-up table in both cases, but to use different—although possibly overlapping—sets of entries for the two values of the load capacitance. The effects of the step-wise modification of the parameter on the output signal, i.e., the output voltage, of the oscillator circuit 2 are apparent in time interval C in FIG. 4.

If, at 17 (at the end of time interval C in FIG. 4), the processing unit 5 has found that the oscillator circuit 2 has ceased to operate regularly—which in FIG. 4 is reflected in a breakdown of the amplitude of its output signal at the beginning of time interval D, the method proceeds with 19 where it adds a safety margin to the parameter value and stores the result as the operating value in the non-volatile memory 6. The safety margin added—which can also be negative, e.g., where the parameter is a load capacitance—is preferably chosen to be a value which has already been used for the parameter and at which the crystal oscillator 2 was found to operate regularly. Where a look-up table is used, the operating value can simply be chosen as the last value but one or some other entry separated by a fixed difference of indices from the current value. In this case the safety margin can be variable, depending on the differences between entries in the look-up table. Where a fixed step-size is used, one or more step-sizes can, as a fixed safety margin, be added to the last value.

In any case, the method proceeds with 13 where the processing unit 5 reads the start-up value back from the non-volatile memory 6 and applies it. After a delay it goes on to 14 where the processing unit 5 reads the operating value from the non-volatile memory 6 and applies it, and ends with 15, just as in the case where it was found in 12 that the start-up value and the operating value were already stored in the non-volatile memory 6.

Afterwards the start-up value is applied again and when, after a delay (time interval D in FIG. 4), the crystal oscillator 2 is assumed to operate regularly, the parameter is set to the operating value (beginning of open-ended time interval F in FIG. 4).

Figure 2:
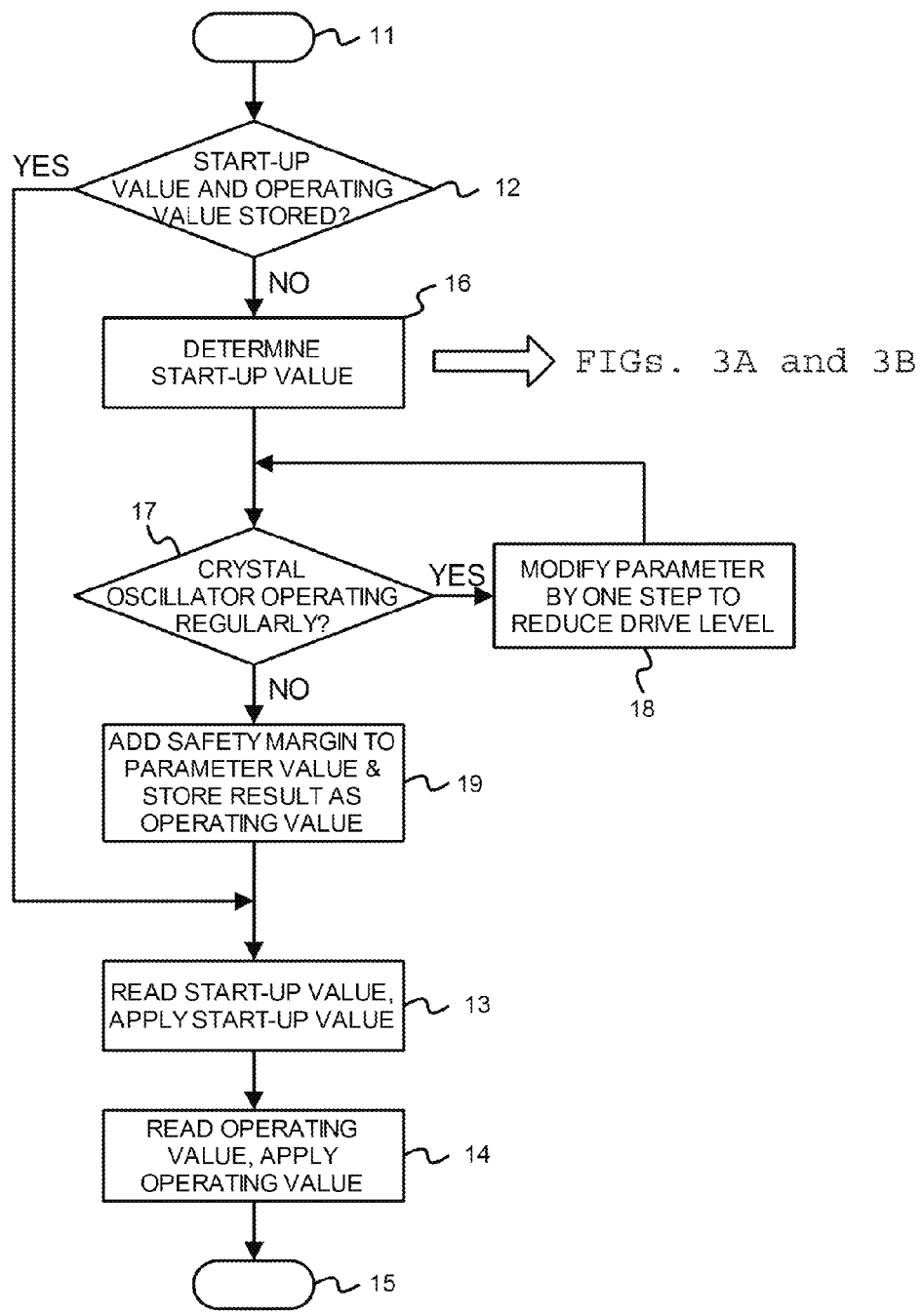
FIG. 2 shows a flow diagram detailing the method according to the invention.
Figure 3A:
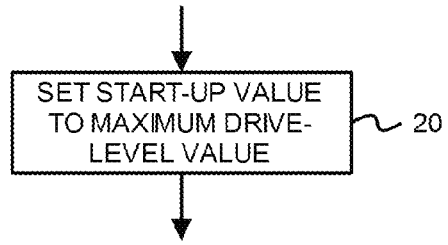
FIGS. 3A and 3B show flow diagrams of a part of the method according to the invention carried out in a preferred embodiment.

The determination of the start-up value at 16 in FIG. 2 can be done by simply setting the start-up value at a value where proper start-up is virtually assured, e.g., start-up has a probability of 95% or more, like a specified maximum drive level provided by the manufacturer of the crystal 3, as shown at 20 in FIG. 3A.

Figure 3B:
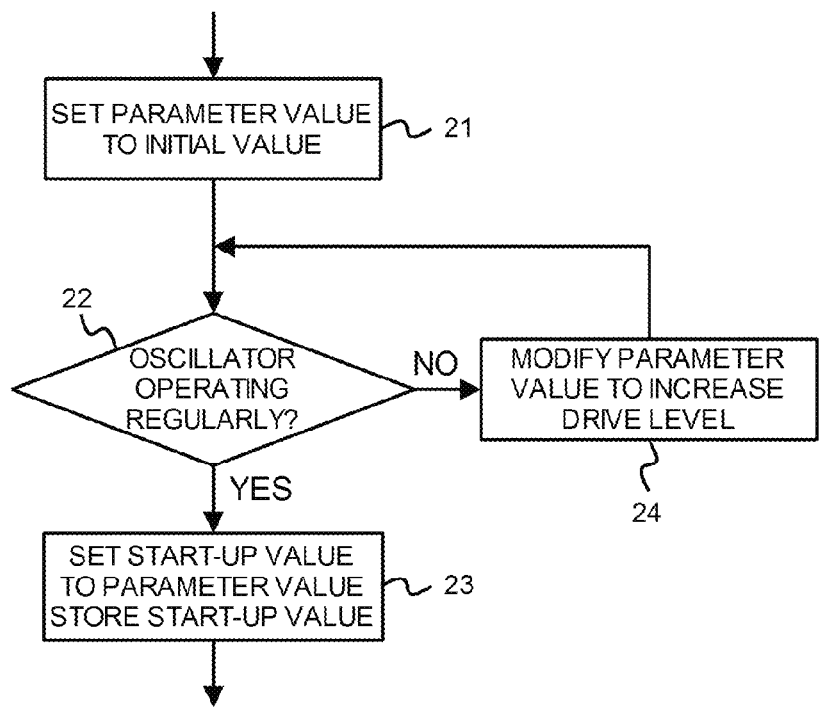

However, it is advantageous to use for start-up as well a drive level which is not very much larger than the drive level required to assure that the crystal oscillator 2 will start up reliably in order to avoid overdriving the crystal 3 with its negative consequences of an elevated risk of damage and high power consumption. For this reason and because it tends to shorten the time needed for determining the operating value, the start-up method shown in FIG. 3B is preferred.

According to this method the processing unit 5 sets, at 21, the start-up value to an initial value stored in non-volatile memory 6 and applies it as a parameter value. The initial value is chosen such that a proper start-up has a moderate probability, e.g., of 50%. The initial value can be determined beforehand in a laboratory as the value which results in about half of the samples in a representative set of crystal oscillators to start up and operate regularly. At 22 the processing unit 5 assesses whether the crystal oscillator 2 is operating regularly, monitoring its output signal. If this is the case the method proceeds to 23 where the processing unit 5 stores the current parameter value, i.e., the initial value, as the start-up value in the non-volatile memory 6. If the crystal oscillator 2 does not operate regularly the processing unit 5 modifies, at 24, the parameter in a way which causes an increase of the drive level and then reverts to 22 for an assessment of whether the crystal oscillator 2 operates regularly or not. If it doesn't the steps in 24 and 22 are repeated, if it does the method proceeds to 23 where the processing unit 5 sets the start-up value to the currently applied parameter value and stores it in the non-volatile memory 6.

The criteria for regular operation are preferably the same as those applied in step 17 (FIG. 2) but other criteria could also be used. The modification of the parameter value at 24 can again be by a fixed amount in each case where the amount can, apart from the sign, which is opposite, be the same or, preferably, larger in order to assure fast start-up. But the modification can also be based on a look-up table which may be the same as the one used in step 18 where the values are, however, run through in the opposite direction. Again, in order to assure a fast start-up, it is possible to use only part of the values stored in the look-up table while skipping others. As an example, there may be values indexed 0 to 42 in the look-up table which are employed one after the other in step 18 while only the entries with indices 42, 32, 24, 13, 6, 0 are used as candidates in step 24.

There is a trade-off between start-up time—which is desired to be short—on the one hand and low drive level—with the advantages of keeping the risk of damage to the crystal 3 as well as energy consumption low—on the other hand. As the drive level associated with the start-up value is only applied for a short time a coarser determination of the latter which may lead to a start-up value which is relatively far removed from an optimum, i.e., which is associated with a drive level which is considerably higher than would be necessary for start-up, is acceptable in the interest of keeping the search for an appropriate start-up value and thereby the start-up period short.

If the start-up value and operating value have been stored in the non-volatile memory 6 after having been determined during a first start-up the start-up procedure is considerably simplified in that the procedure will always proceed directly from 12 to 13 (FIG. 2). However, if such start-up fails, e.g., due to a change in the properties of crystal 3, it is always possible to revert to the 'first start-up' type and determine and store start-up value and operating value anew.

LIST OF REFERENCE SYMBOLS 1 apparatus
2 crystal oscillator
3 crystal
4 oscillator circuit
5 processing unit
6 non-volatile memory
7 switch
8 auxiliary oscillator
9 counter
10 counter
11-23 method steps

The invention claimed is:

1. A method of starting up a crystal oscillator with a crystal and an oscillator circuit connected to a non-volatile memory, where a parameter which controls a drive level of the crystal is configured, the method comprising:
   setting the value of the parameter to a start-up value where the associated drive level is high enough to assure that the crystal oscillator begins to oscillate,
   modifying the value of the parameter such as to monotonically reduce the drive level of the crystal while monitoring the crystal oscillator,
   determining, in the course of monitoring the crystal oscillator, a breakdown value of the parameter where the crystal oscillator ceases to operate regularly, employing as a criterion of regular operation the condition that a cycle count of the crystal oscillator signal does not deviate from a cycle count of a reference signal by more than a predetermined amount, and
   selecting an operating value of the parameter such that the drive level associated with said operating value is above the drive level associated with the breakdown value by a safety margin.

2. The method of claim 1, wherein modifying the value of the parameter comprises modifying the value of the parameter in discrete steps.

3. The method of claim 2, further comprising, reading, at every step, a value of the parameter from a look-up table in the non-volatile memory.

4. The method of claim 3, wherein the operating value is selected from values of the parameter previously used during the step-wise modification.

5. The method of claim 1, further comprising storing the operating value of the parameter in the non-volatile memory.

6. The method of claim 1, further comprising choosing the start-up value of the parameter as a specified maximum drive level value of the crystal.

7. The method of claim 1, further comprising reading the start-up value of the parameter from the non-volatile memory.

8. The method of claim 1, further comprising determining the start-up value of the parameter by choosing an initial value where the associated drive level is high enough that the probability of the crystal oscillator beginning to operate regularly is at least 50% and monitoring the crystal oscillator,
   if the crystal oscillator is found not to operate regularly, modifying the value of the parameter such as to monotonically increase the drive level of the crystal while monitoring the crystal oscillator until the latter is found to operate regularly, storing, in the non-volatile memory, a value of the parameter where the drive level of the crystal is at least as high as the drive level associated with the value of the parameter where the crystal oscillator has been found to operate regularly as the start-up value.

9. The method of claim 8, wherein the initial value of the parameter is read from the non-volatile memory.

10. The method of claim 1, further comprising:
setting the value of the parameter to the start-up value and, after a delay,
changing the value of the parameter to the operating value.

11. An apparatus comprising:
a crystal oscillator with a crystal and an oscillator circuit connected to the crystal oscillator to define a drive level for the crystal,
an auxiliary oscillator that provides a reference signal and at least one counter connected to the crystal oscillator and the auxiliary oscillator, and
a processing unit to determine at least a parameter controlling the drive level and to feed said parameter to the oscillator circuit, the processing unit being configured to:
set the value of the parameter to a start-up value where the associated drive level is high enough to assure that the crystal oscillator begins to operate regularly,
modify the value of the parameter such that the drive level of the crystal is monotonically reduced while the crystal oscillator is being monitored until the crystal oscillator ceases to operate regularly,
determine a breakdown value of the parameter where the crystal oscillator has been found to cease to operate regularly, employing as a criterion of regular operation that a cycle count of the crystal oscillator signal deviates from a cycle count of the reference signal by less than a predetermined amount, and
select an operating value of the parameter such that the drive level associated with the operating value is above the drive level associated with the breakdown value by a safety margin.

12. The apparatus of claim 11, wherein the modification of the parameter is step-wise and the non-volatile memory comprises a look-up table where discrete values of the parameter are stored which are used in the step-wise modification.

13. The apparatus of claim 12, wherein the operating value is selected from values of the parameter previously used during the step-wise modification.

14. The apparatus of claim 11, wherein the processing unit is connected to a non-volatile memory for storing a start-up value of the parameter and an operating value of the parameter, and the processing unit is configured to store the operating value of the parameter in the non-volatile memory.

15. The apparatus of claim 11 wherein the start-up value of the parameter is a predetermined value stored in the non-volatile memory.

16. The apparatus claim 11 wherein the processing unit is configured to determine the start-up value of the parameter by
choosing an initial value where the associated drive level is high enough that the probability of the crystal oscillator beginning to operate regularly is at least 50% and monitoring whether the crystal oscillator operates regularly,
if the crystal oscillator does not operate regularly, modifying the value of the parameter such as to monotonically increase the drive level of the crystal while monitoring the crystal oscillator until the crystal oscillator is found to operate regularly,
storing a value of the parameter where the drive level of the crystal is at least as high as the drive level associated with the value of the parameter where the crystal oscillator has been found to operate regularly as the start-up value in the non-volatile memory.

17. The apparatus of claim 16, wherein the initial value of the parameter is a predetermined value stored in the non-volatile memory.

18. The apparatus of claim 11 wherein the processing unit is further configured to:
set the value of the parameter to the start-up value and, after a delay,
change the value of the parameter to the operating value.

* * * * *